(12) United States Patent  (10) Patent No.: US 8,329,306 B2
Oouchi et al.  (45) Date of Patent: Dec. 11, 2012

(54) BARRIER LAMINATE, GAS BARRIER FILM, AND DEVICE USING THE SAME

(75) Inventors: Ryou Oouchi, Kanagawa (JP); Jiro Tsukahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 507 days.

(21) Appl. No.: 12/715,456

(22) Filed: Mar. 2, 2010

(65) Prior Publication Data
US 2010/0227178 A1 Sep. 9, 2010

(30) Foreign Application Priority Data

Mar. 3, 2009 (JP) ................. 2009-049174

(51) Int. Cl.
*B32B 27/36* (2006.01)
(52) U.S. Cl. ............. 428/451; 204/192.15; 427/255.28
(58) Field of Classification Search ............. 204/192.15; 427/255.28; 428/451
See application file for complete search history.

(56) References Cited

U.S. PATENT DOCUMENTS

| 2,681,294 | A | 6/1954 | Beguin |
| 2003/0077453 | A1 | 4/2003 | Oaku et al. |
| 2004/0046497 | A1 | 3/2004 | Schaepkens et al. |
| 2008/0309226 | A1 | 12/2008 | Kim et al. |

FOREIGN PATENT DOCUMENTS

| EP | 1 518 912 A1 | 3/2005 |
| EP | 1 886 800 A1 | 2/2008 |
| JP | 5127822 | 5/1993 |
| JP | 10-512104 A | 11/1998 |
| JP | 2000-98326 A | 4/2000 |
| JP | 2000-227603 A | 8/2000 |
| JP | 2000-323273 A | 11/2000 |
| JP | 2001-150584 A | 6/2001 |
| JP | 2003-48913 A | 2/2002 |
| JP | 2002-80616 A | 3/2002 |
| JP | 2004-25732 A | 1/2004 |
| JP | 2004-299230 A | 10/2004 |
| JP | 2006-289627 A | 10/2006 |
| JP | 2007-30387 A | 2/2007 |
| WO | WO-97/15947 A1 | 5/1997 |

OTHER PUBLICATIONS

Extended European Search Report dated Aug. 16, 2010 which issued in corresponding EP application No. 10155310.5.
Tae Won Kim et al.; Transparent hybrid inorganic/organic barrier coatings for plastic organic light-emitting diode substrates; Journal of Vacuum Science and Technology A; vol. 23, No. 4, pp. 971-977; Jul./Aug. 2005.
G. Nisato et al.; SID Conference Record of the International Display Research Conference, pp. 1435-1438, Oct. 2001.

*Primary Examiner* — D. S. Nakarani
(74) *Attorney, Agent, or Firm* — Birch, Stewart, Kolasch & Birch, LLP

(57) ABSTRACT

Provided is a barrier laminate having higher barrier property. The barrier laminate has an organic layer obtained by curing a polymerizable composition comprising a compound represented by the following formula (1);

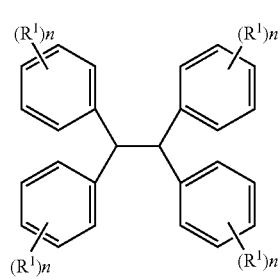

formula (1)

wherein $R^1$'s represent a substituent, and $R^1$'s each may be the same or different to each other; n's are an integer of 0 to 5, and n's each may be the same or different to each other; provided that at least one of $R^1$'s comprises a polymerizable group.

23 Claims, No Drawings

BARRIER LAMINATE, GAS BARRIER FILM, AND DEVICE USING THE SAME

BACKGROUND OF THE INVENTION

1. Field of the Invention

The present invention relates to a barrier laminate, a gas barrier film and a device using the barrier laminate or the gas barrier film.

2. Description of the Related Art

Heretofore, a variety of barrier laminates have been studied. For example, JP-A-2004-299230 discloses a gas barrier film using a cardo polymer layer as a planarizing layer. However, there is a demand for higher barrier property in a gas barrier film.

SUMMARY OF THE INVENTION

The object of the invention is to solve the above problem and to provide a barrier laminate having higher barrier property.

The present inventors have tried to enhance plasma resistance and glass transition temperature (Tg) of an organic layer of a barrier laminate. They have assiduously studied and, as a result, have found that, an organic layer obtained by polymerizing polymerizable monomers having a particular structure has higher plasma resistance and higher glass transition temperature, and thereby they have completed the present invention.

(1) A barrier laminate comprising at least one organic layer and at least one inorganic layer, wherein the organic layer is obtained by curing a polymerizable composition comprising a compound represented by the following formula (1);

formula (1)

wherein $R^1$'s represent a substituent, and $R^1$'s each may be the same or different to each other; n's are an integer of 0 to 5, and n's each may be the same or different to each other; provided that at least one of $R^1$ comprises a polymerizable group.

(2) The barrier laminate according to (1), wherein the polymerizable group in the formula (1) is a (meth)acryloyl group.

(3) The barrier laminate according to (1) or (2), wherein the compound represented by the formula (1) has two or more polymerizable groups.

(4) The barrier laminate according to (1) or (2), wherein the compound represented by the formula (1) has three or more polymerizable groups.

(5) The barrier laminate according to any one of (1) to (4), wherein at least one of $R^1$'s is a group consisting of a polymerizable group and at least one selected from —$CR^2_2$— ($R^2$ represents a hydrogen atom or a substituent), —CO—, —O—, and a phenylene group.

(6) The barrier laminate according to any one of (1) to (5), wherein at least one of $R^1$ comprises a hydroxy group.

(7) The barrier laminate according to any one of (1) to (6), wherein at least one of $R^1$'s has a molecular weight of 10 to 250.

(8) The barrier laminate according to any one of (1) to (7), wherein at least two of $R^1$'s have the same structure to each other.

(9) The barrier laminate according to any one of (1) to (8), wherein at least one of $R^1$'s has a molecular weight of 70 to 150.

(10) The barrier laminate according to any one of (1) to (9), wherein the compound represented by the formula (1) has a molecular weight of 600 to 1400.

(11) The barrier laminate according to any one of (1) to (10), wherein the polymerizable composition further comprises an acidic monomer.

(12) The barrier laminate according to (11), wherein the acidic monomer has a (meth)acrylate having a phosphate group.

(13) The barrier laminate according to any one of (1) to (12), wherein the inorganic layer comprises a metal oxide or a metal nitride.

(14) The barrier laminate according to (13), wherein the metal oxide or the metal nitride is silicon oxide, aluminum oxide, or silicon aluminum oxide.

(15) The barrier laminate according to (13) or (14), wherein the inorganic layer comprising the metal oxide or the metal nitride is an inorganic layer formed by a sputtering method.

(16) The barrier laminate according to (13) or (14), wherein the inorganic layer comprising the metal oxide or the metal nitride is an inorganic layer formed by a CVD method.

(17) The barrier laminate according to any one of (1) to (16), wherein at least two organic layers and at least two inorganic layers are alternately laminated.

(18) A gas barrier film, comprising the barrier laminate according to any one of (1) to (17) on a substrate film.

(19) A device, comprising the gas barrier film according to (18) as a substrate.

(20) A device sealed with the gas barrier film according to (18).

(21) A device sealed with the barrier laminate according to any one of (1) to (17).

(22) The device according to any one of (19) to (21), wherein the device is an electronic device.

(23) The device according to any one of (19) to (21), wherein the device is an organic electroluminescence device.

(24) A method for manufacturing the barrier laminate according to any one of (1) to (17), comprising forming an inorganic layer by a sputtering method.

(25) A method for manufacturing the barrier laminate according to any one of (1) to (17), comprising forming an inorganic layer by a CVD method.

The invention made it possible to provide a barrier laminate in which the barrier property is improved.

BEST MODE FOR CARRYING OUT THE INVENTION

The contents of the present invention are described in detail hereinunder. In this description, the numerical range expressed by the wording "a number to another number" means the range that falls between the former number indicating the lowermost limit of the range and the latter number indicating the uppermost limit thereof. "Organic EL device" as referred to herein means an organic electroluminescent device. In addition, "(meth)acrylate" means acrylate and methacrylate in the present specification.

<Barrier Laminate>

The barrier laminate of the invention preferably comprises an organic layer and an inorganic layer on a surface of the organic layer, and is more preferably a barrier laminate in which at least two organic layers and at least two inorganic layers are alternately laminated.

The barrier laminate of the invention may comprise a gradation material layer where an organic region and an inorganic region continuously change in the thickness direction of the layer without deviating from the gist of the invention. As examples of the gradation material, there are mentioned materials described in Kim et al's report, Journal of Vacuum Science and Technology A Vol. 23 pp. 971-977 (2005 American Vacuum Society); and gradation layers of an organic region and an inorganic region laminated with no boundary therebetween as in US Laid-Open 2004-46497.

(Organic Layer)

The organic layer of the invention is obtainable by curing a polymerizable composition comprising a compound represented by the following formula (1);

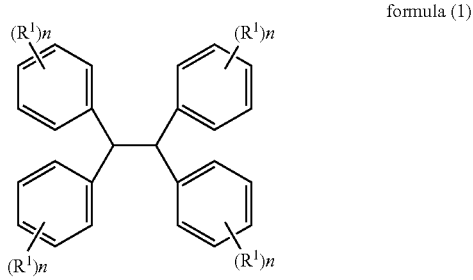

formula (1)

wherein $R^1$'s represent a substituent, and $R^1$'s each may be the same or different to each other; n's are an integer of 0 to 5, and n's each may be the same or different to each other; provided that at least one of $R^1$'s comprises a polymerizable group.

The substituent of $R^1$ is preferably a group consisting of a polymerizable monomer and at least one selected from —$CR^2{}_2$— ($R^2$ is a hydrogen atom or a substituent), —CO—, —O—, a phenylene group, —S—, —C≡C—, —$NR^3$— ($R^3$ is a hydrogen atom or a substituent), and —$CR^4$=$CR^5$— ($R^4$, $R^5$ each are a hydrogen atom or a substituent), more preferably a group consisting of a polymerizable group and at least one selected from —$CR^2{}_2$— ($R^2$ represents a hydrogen atom or a substituent), —CO—, —O—, and a phenylene group.

$R^2$ represents a hydrogen atom or a substituent, preferably a hydrogen atom or a hydroxy group.

At least of $R^1$'s preferably comprises a hydroxy group. By comprising a hydroxy group, the curability of the organic layer is enhanced. At least one of $R^1$'s preferably has a molecular weight of 10 to 250, more preferably 70 to 150.

$R^1$ is preferably positioned at least at a para position.

n's each are preferably an integer of 0 to 5, more preferably 0 to 2, furthermore preferably 0 or 1. Particularly preferable is that both of n's are 1.

In the compound represented by the formula (1), at least two of $R^1$'s have the same structure to each other. Further preferable is that all of n are 1 and two of $R^1$'s have the same structure to each other and the other two of $R^1$'s have the same structure to each other, or that all of n are 1 and all of $R^1$'s have the same structure to each other. Particularly preferable is that all of n's are 1 and all of $R^1$'s have the same structure to each other.

The polymerizable group in the formula (1) is preferably a (meth)acryloyl group, or an epoxy group, more preferably a (meth)acryloyl group. The compound represented by the formula (1) has preferably two or more polymerizable groups, more preferably three or more polymerizable groups. The upper limit of the number of the polymerizable groups is not specifically limited. However, the upper limit is preferably 8 or less, more preferably 6 or less.

The molecular weight of the compound represented by the formula (1) is preferably 600 to 1400, more preferably 800 to 1200.

The polymerizable composition in the invention may comprise one kind of the compound represented by the formula (1), or two or more kinds of the compounds represented by the formula (1). The polymerizable composition comprising two or more kinds of the compounds represented by the formula (1) is exemplified by those comprising compounds represented by the formula (1), which have $R^1$ having the same structure to each other and have different numbers of $R^1$'s to each other, and isomers thereof.

Preferred specific examples of the compound represented by the formula (1) are described below. However, the compounds which can be used in the invention are not restricted to them. In the following compounds, compounds wherein four of n are 1 is exemplified. However, preferable examples thereof include compounds in which one or two or three of n's are 0 (for example, those having two or three functional groups), or, compounds in which one or two or three or more of n's are 2 or more (those in which two or more of $R^1$'s bond to one ring; for example, compounds having five or six functional groups, or the like).

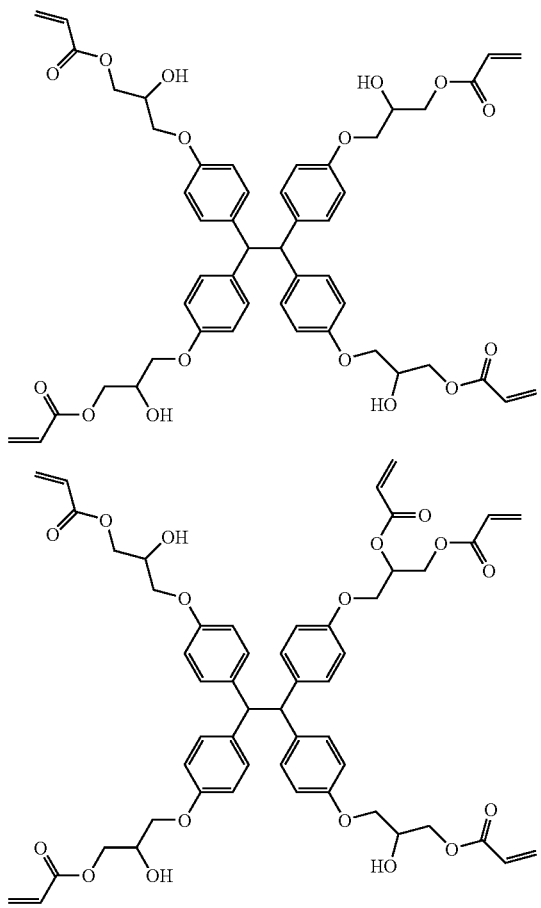

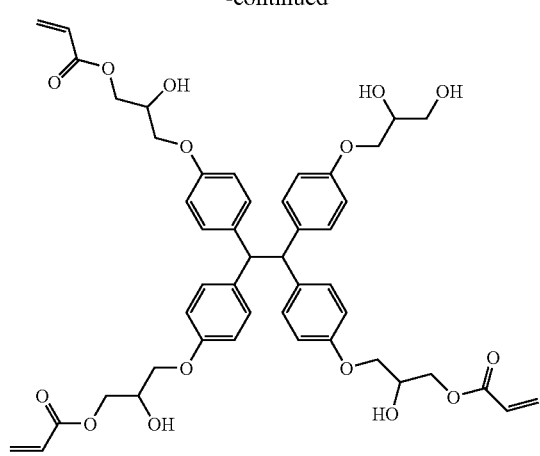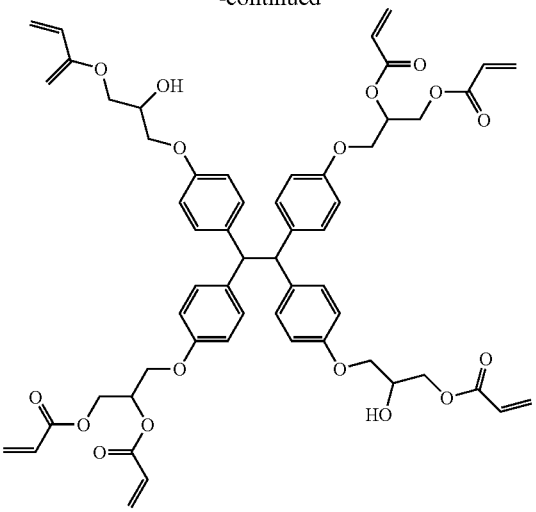

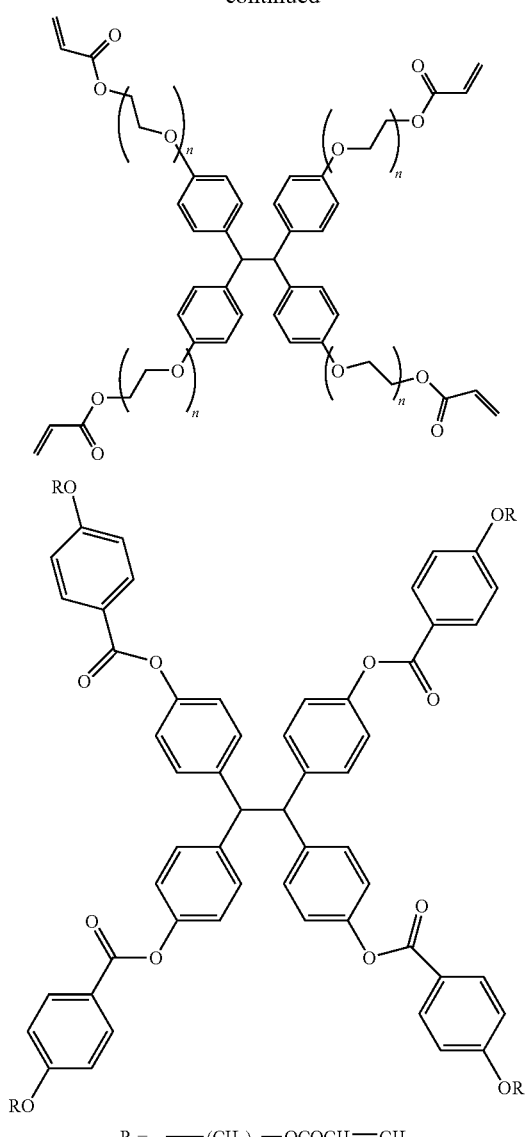
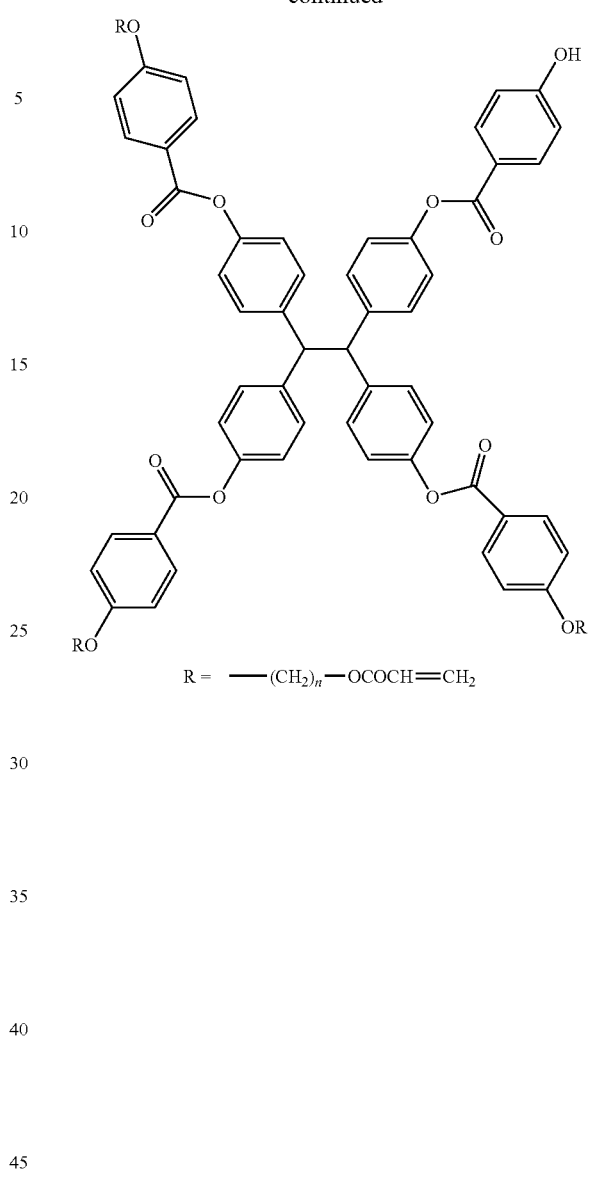

9
-continued
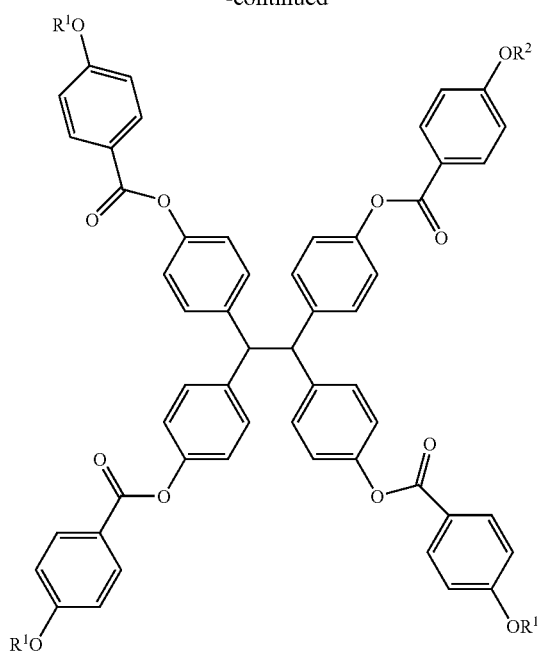
$R^1 = $ —$(CH_2)_n$—$OCOCH\!=\!CH_2$
$R^2 = $ —$(CH_2)_n OH$
10
-continued
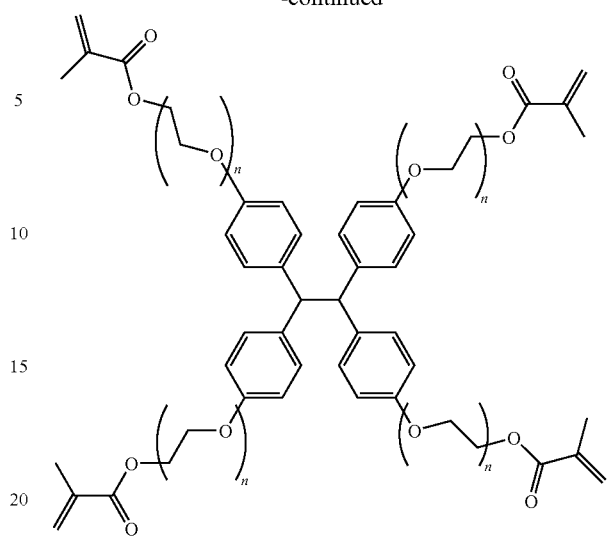
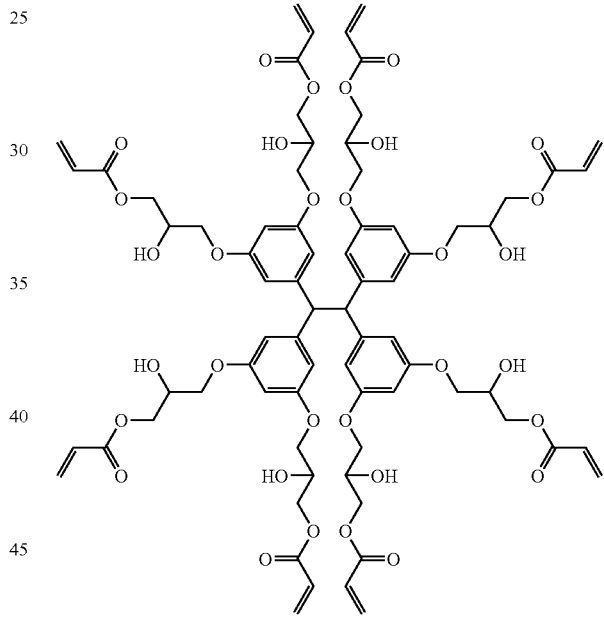
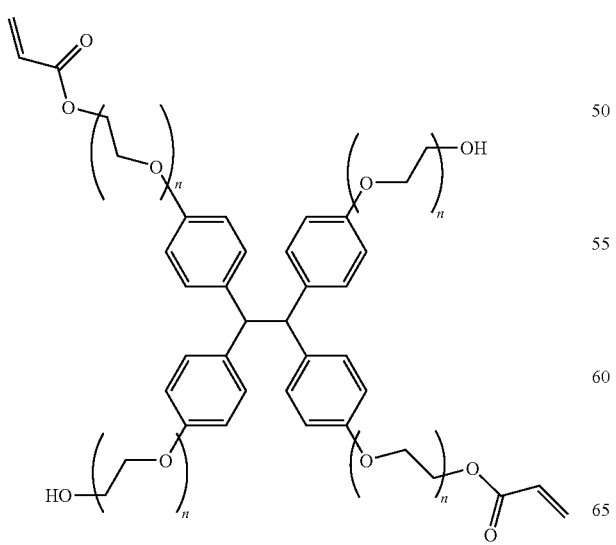
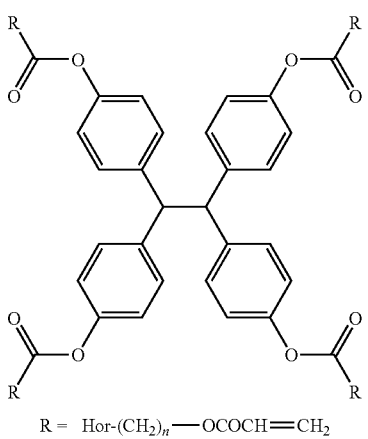
R = $Hor$-$(CH_2)_n$—$OCOCH\!=\!CH_2$

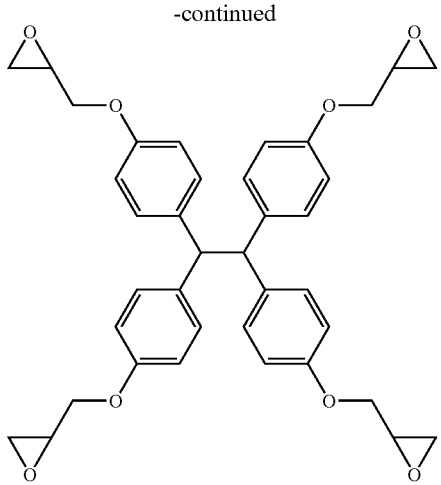

As the above compounds, commercial products are available. In addition, the above compounds may be synthesized by known methods. For example, an epoxyacrylate is obtainable by reacting an epoxy compound with an acrylic acid. In the reaction, compounds having two, three or five functional groups or isomers thereof may be produced. In the case where isolation of those isomers is required, the isolation may be carried out by column chromatography. However, a mixture of those compounds may be used in the invention.

Other Polymerizable Compound

The composition for the organic layer in the invention may comprise a polymerizable compound in addition to the compound represented by the formula (1). Such a polymerizable compound is not specifically limited for its kind and the like. The other polymerizable compound is preferably a radical polymerizable compound and/or a cation polymerizable compound having an ether group as a functional group, more preferably a compound having an ethylenic unsaturated bond at a terminal or in a side chain and/or a compound having an epoxy group or an oxetane group at a terminal or in a side chain. Of those, more preferred is a compound having an ethylenic unsaturated bond at a terminal or in a side chain. Examples of the a compound having an ethylenic unsaturated bond at a terminal or in a side chain include a (meth)acrylate compound, an acrylamide compound, a styrene compound, and a maleic acid anhydrides. Of those, preferably is a (meth)acrylate compound and/or a styrene compound, more preferably a (meth)acrylate compound.

The (meth)acrylate compounds are preferably a (meth)acrylate, an urethane (meth)acrylate, a polyester (meth)acrylate, an epoxy (meth)acrylate.

The styrene compound is preferably styrene, α-methylstyrene, 4-methylstyrene, divinylbenzene, 4-hydroxystyrene, or 4-carboxystyrene.

Specific examples of the (meth)acrylate compound for preferable use in the invention are described below. However, the compounds which can be used in the invention are not limited to them.

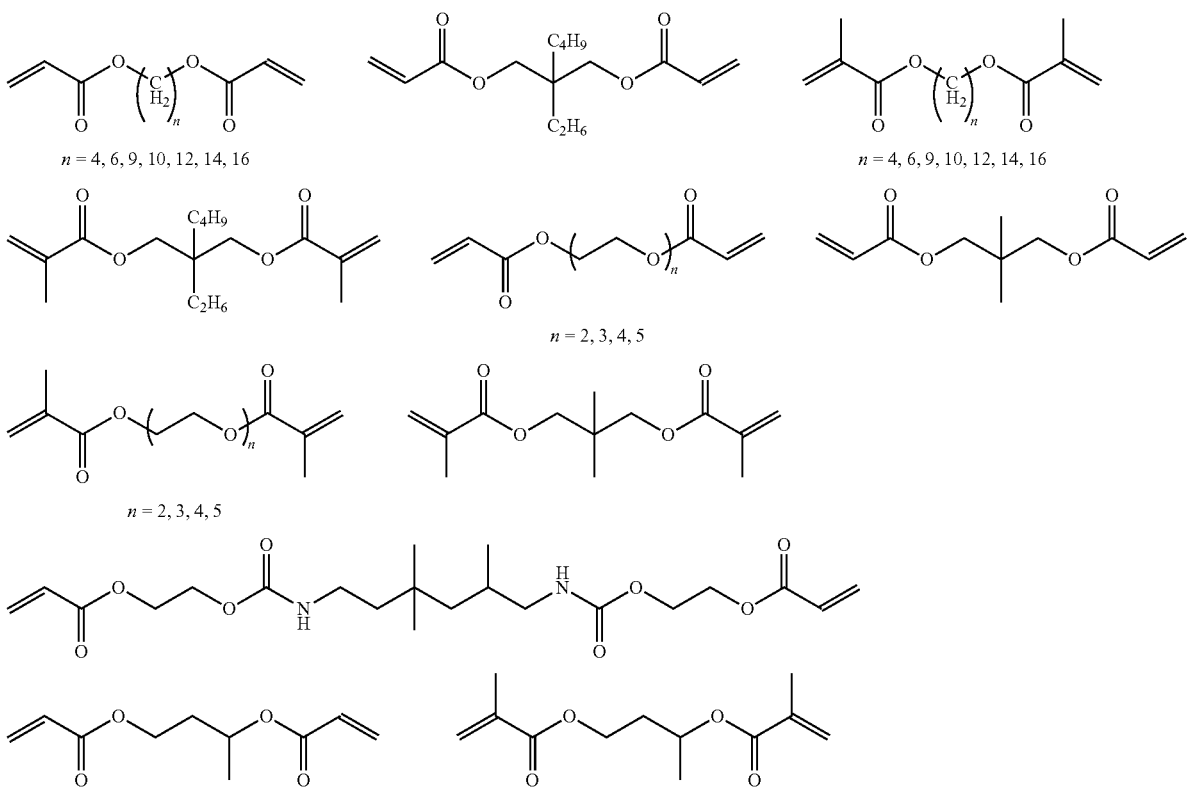

-continued
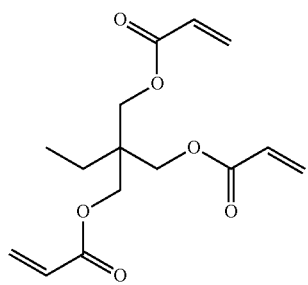
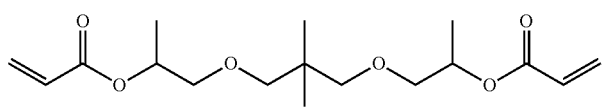
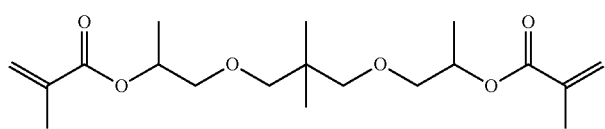
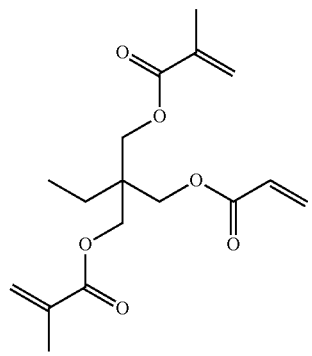
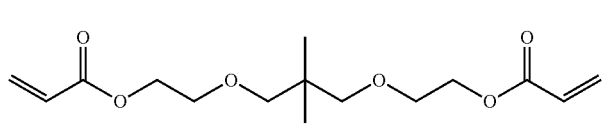
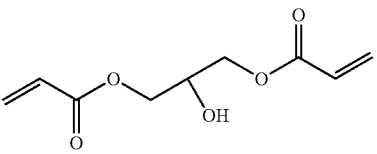
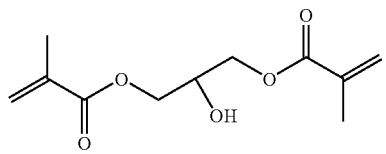
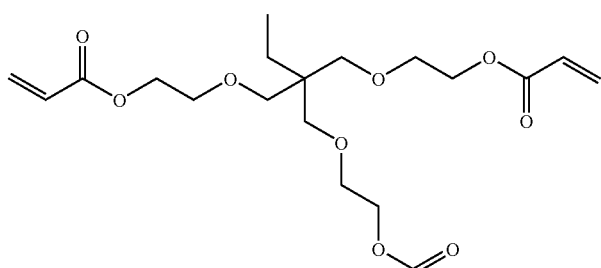
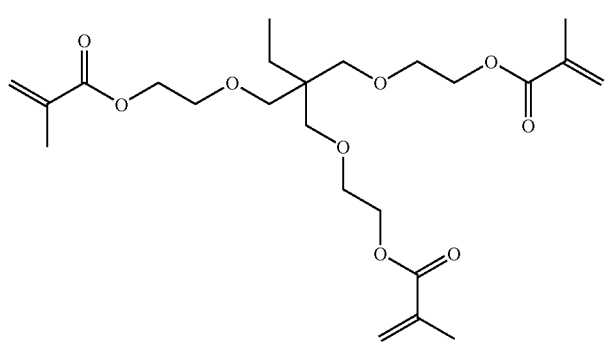
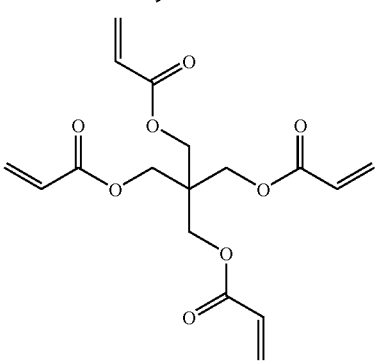

-continued
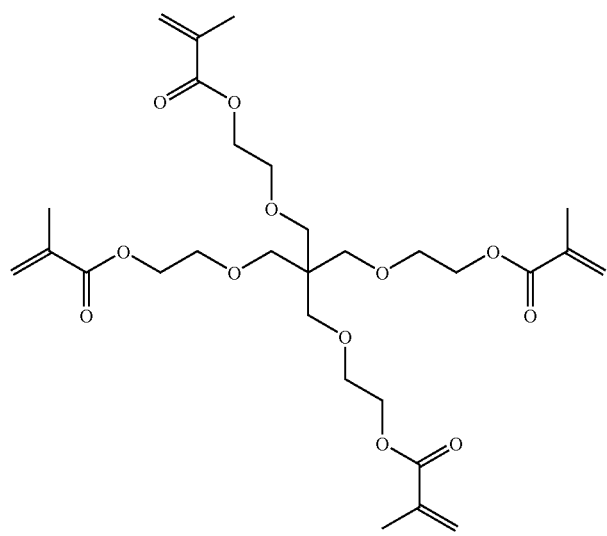
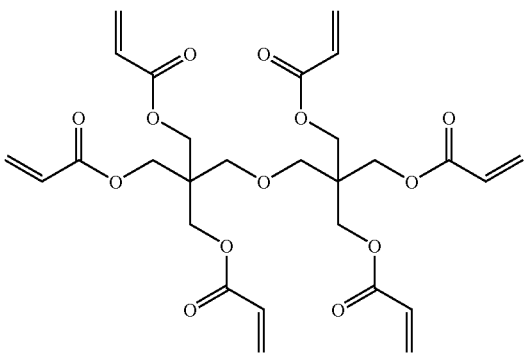
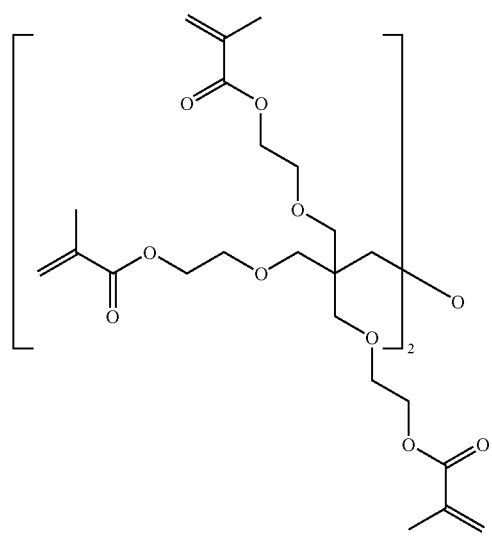
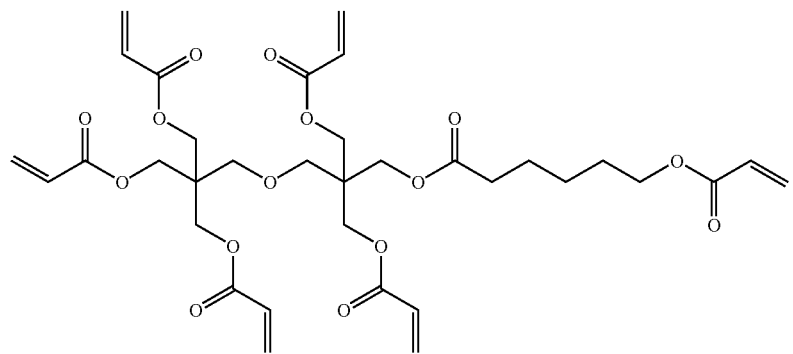

-continued
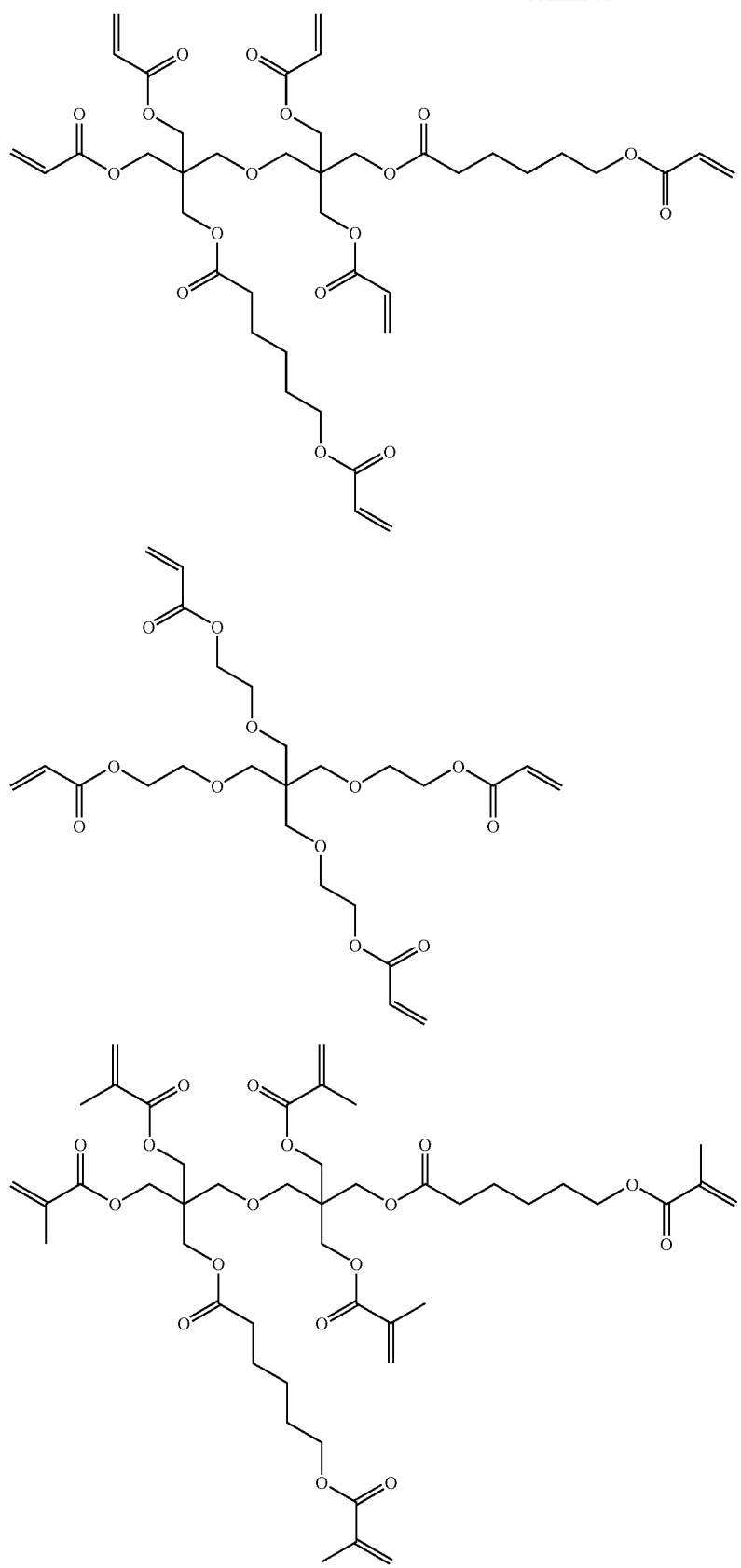

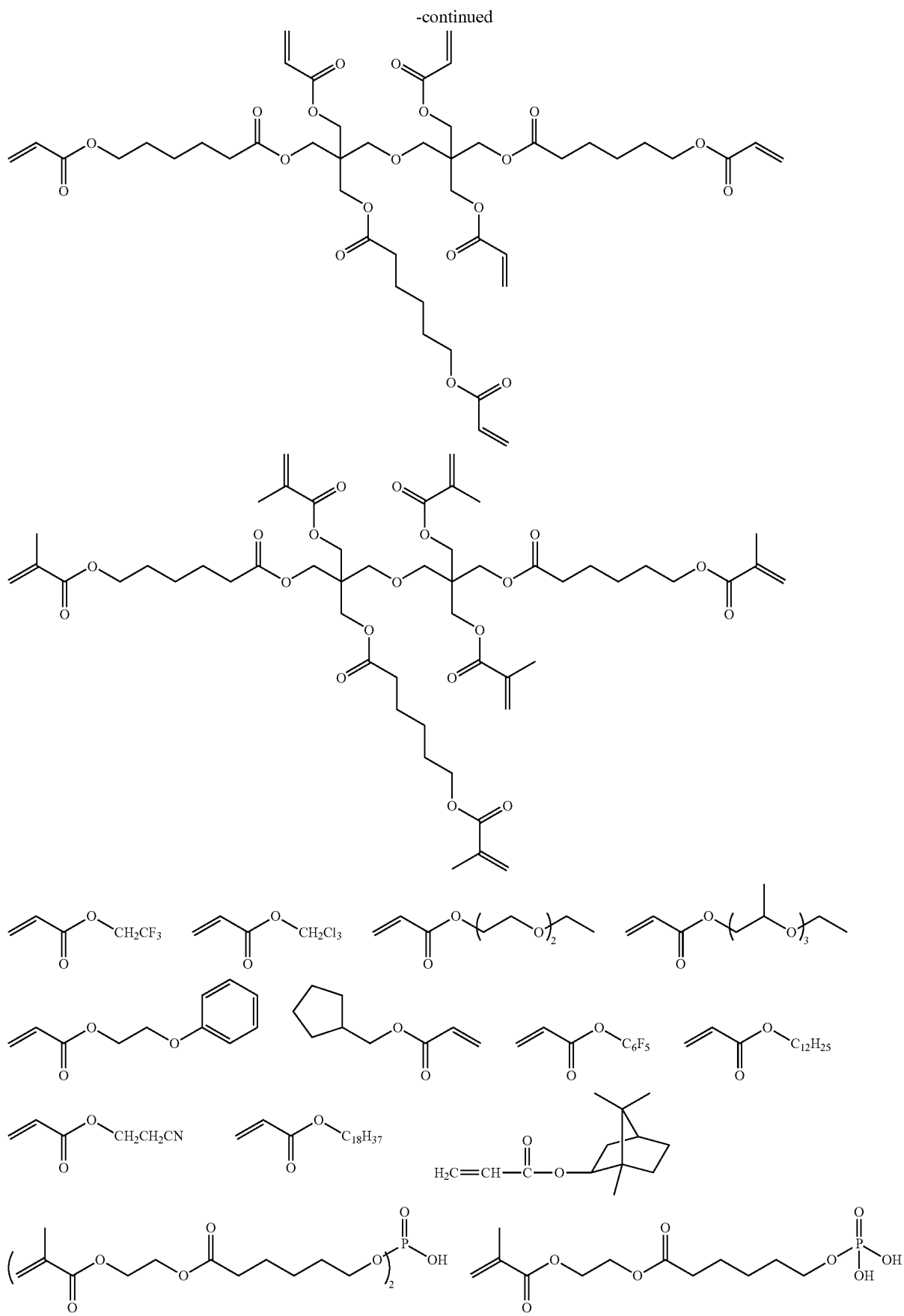

-continued

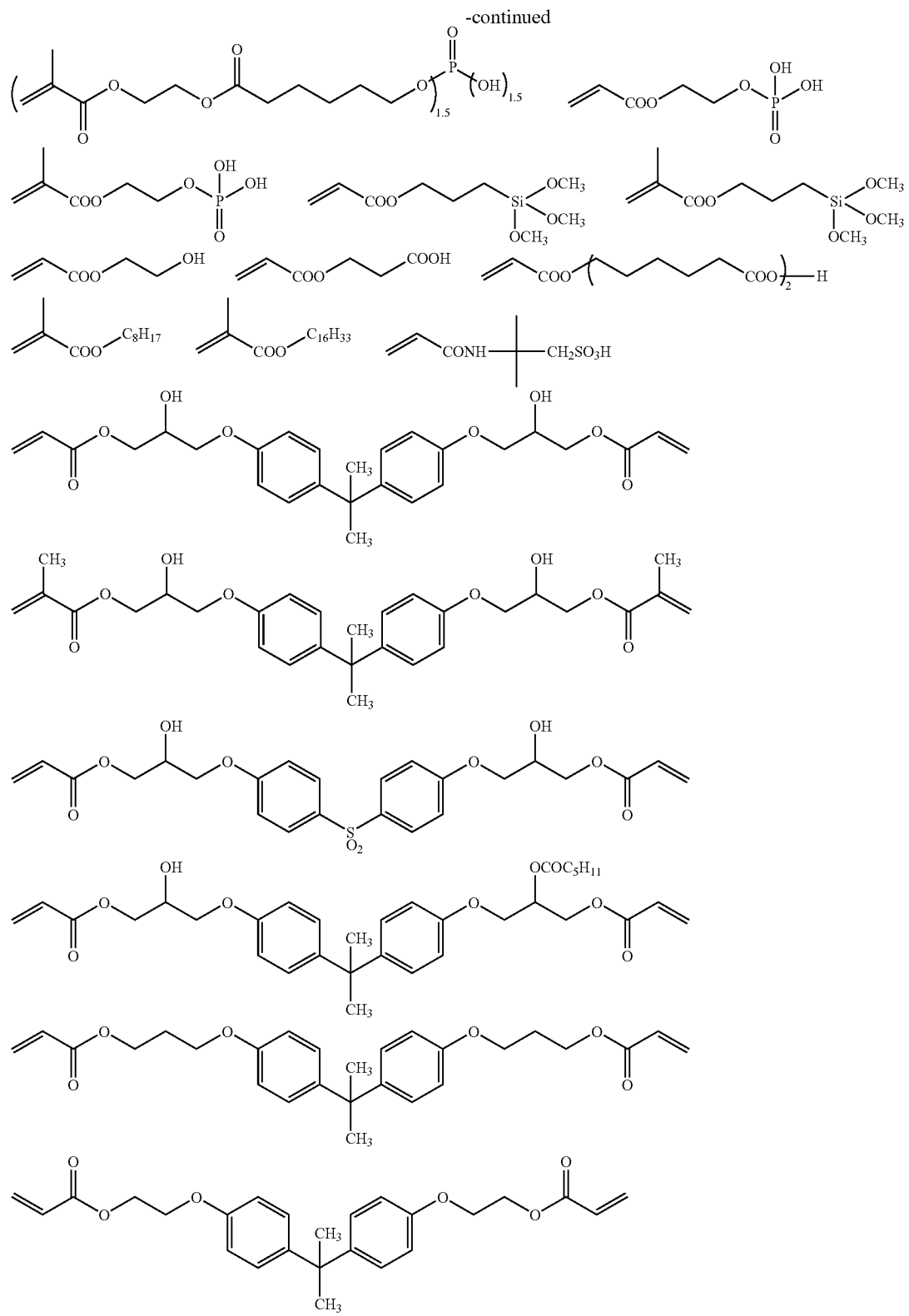

(Acidic Monomers)

The polymerizable composition used in the present invention may comprise an acidic monomer. The inclusion of the acidic monomer enhances adhesiveness between layers. The acidic monomer used in the present invention is preferably monomers having a carbonic acid group, a sulfonic group, a phosphate group or a phosphonic group. The acidic monomer used for the invention preferably is a monomer having a carbonic acid group or a phosphate group, more preferably a (meth)acrylate having a carbonic acid group or a phosphate group, still more preferably a (meth)acrylate having a phosphate group. ((Meth)acrylate having a phosphoester group)

The (meth)acrylate having a phosphate group is preferably a compound represented by the formula (P). The inclusion of the (meth)acrylate compound having a phosphorester group enhances adhesion to the inorganic layer.

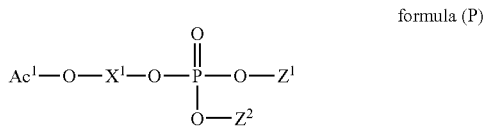

formula (P)

wherein $Z^1$ represents $Ac^2$—O—$X^2$—, a substituent group not having a polymerizable group, or a hydrogen atom; $Z^2$ represents $Ac^3$—O—$X^3$—, a substituent group not having a polymerizable group, or a hydrogen atom; $Ac^1$, $Ac^2$ and $Ac^3$ each represent an acryloyl group or a (meth)acryloyl group; and $X^1$, $X^2$ and $X^3$ each represent a divalent linking group.

The compound represented by the formula (P) is preferably a monofunctional monomer represented by the formula (P-1), a bifunctional monomer represented by the formula (P-2), or a trifunctional monomer represented by the formula (P-3):

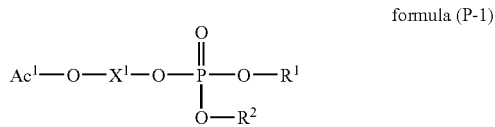

formula (P-1)

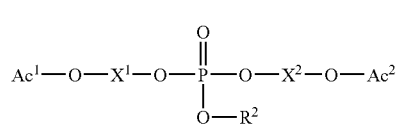

formula (P-2)

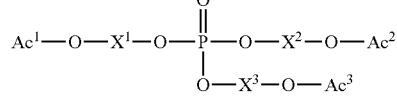

formula (P-3)

The definitions of $Ac^1$, $Ac^2$, $Ac^3$, $X^1$, $X^2$ and $X^3$ are the same as those in the formula (P). In the formula (P-1) and formula (P-2), $R^1$ represents a substituent not having a polymerizable group or a hydrogen atom, and $R^2$ represents a substituent group not having a polymerizable group, or a hydrogen atom.

In the formula (P), (P-1), (P-2) and (P-3), $X^1$, $X^2$ and $X^3$ each are a divalent linking group. Examples of the divalent linking group include an alkylene group (for example, ethylene group, 1,2-propylene group, 2,2-propylene group (which may be referred to as 2,2-propylidene group, 1,1-dimethyl methylene group), 1,3-propylene group, 2,2-dimethyl-1,3-proplylene group, 2-buthyl-2-ethyl-1,3-propylene group, 1,6-hexylene group, 1,9-nonylene group, 1,12-dodecene, 1,16-hexydecene), an arylene group (for example, phenylene group, naphtylene group), an ether group, an imino group, a carbonyl group, a sulfonyl group, and a divalent residue in which two or more those groups are bonded to each other in series (for example, polyethylene oxyethylene group, polyethylene oxypropylene group, 2,2-propylenephenylene group). Those groups may have a substituent. Of those, preferred is an alkylene group, an arylene group, or a divalent residue in which two or more those groups are bond to each other in series. $X^1$, $X^2$ and $X^3$ each are preferably an alkylene group, an alkyleneoxy carbonyl alkylene group, or a combination thereof.

In the formula (P), (P-1), (P-2) and (P-3), examples of the substituent not having a polymerizable group include an alkyl group, an aryl group, and a group consisting of a combination thereof.

The carbon number of the alkyl group is preferably 1 to 12, more preferably 1 to 9, still more preferably 1 to 6. Examples of the alkyl group include methyl group, ethyl group, propyl group, butyl group, pentyl group and hexyl group. The alkyl group may be a linear, branched, or cyclic group, preferably a linear alkyl group. The alkyl group may be substituted with an alkoxy group, an aryl group, an aryloxy group, or the like.

The carbon number of the aryl group is preferably 6 to 14, more preferably 6 to 10. Examples of the aryl group include phenyl group, 1-naphthyl group and 2-naphtyl group. The aryl group may be substituted with an alkyl group, an alkoxy group, an aryloxy group, or the like.

In the present invention, the monomer represented by the formula (P) may be used singly or as combined. When the compounds are used as combined, may be used a combination comprising two or more kinds of a monofunctional compound represented by the formula (P-1), a bifunctional compound represented by the formula (P-2) and a trifunctional compound represented by the formula (P-3).

In the present invention, as the above polymerizable monomers having a phosphate group, may be used commercially available compounds such as KAYAMER series manufactured by NIPPON KAYAKU CO., LTD, and Phosmer series manufactured by Uni chemical. The polymerizable monomers may be newly synthesized.

Specific examples of the (meth)acrylate having a phosphate group, which is preferably used in the present invention, mentioned below, to which, however, the present invention should not be limited.

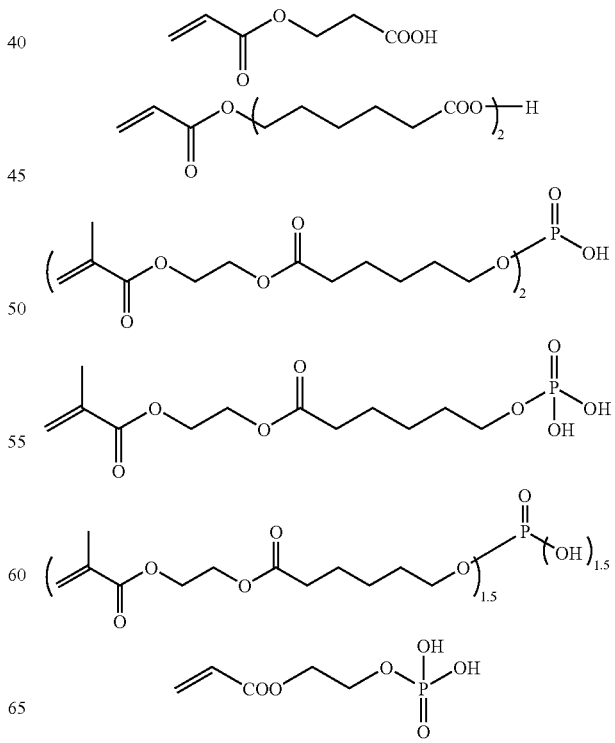

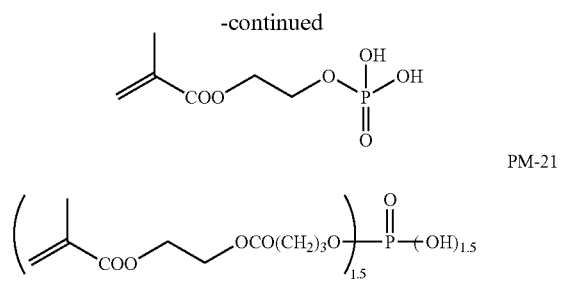

PM-21

The polymerizable composition for use in the invention preferably comprise a compound represented by the formula (1) and the other polymerizable compound, preferably the acidic monomer, at the weight ratio of 10:90 to 100:0, more preferably 20:80 to 100:0, further more preferably 50:50 to 98:2.

(Polymerization Initiator)

The polymerizable composition in the present invention may include a polymerization initiator. In the case where a photopolymerization initiator is used, its amount is preferably at least 0.1 mol % of the total amount of the polymerizing compound, more preferably from 0.5 to 2 mol %. By setting the thus-designed composition, polymerization reaction though an active ingredient forming reaction may be suitably controlled. Examples of the photopolymerization initiator include Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Lamberti's commercial products, Ezacure series (e.g., Ezacure TZM, Ezacure TZT, Ezacure KTO46), etc.

(Method of Formation of Organic Layer)

The method for forming the organic layer is not specifically defined. For example, the layer may be formed according to a solution coating method or a vacuum film formation method. The solution coating method is, for example, a dipping method, an air knife coating method, a curtain coating method, a roller coating method, a wire bar coating method, a gravure coating method, a slide coating method, or an extrusion coating method using a hopper as in U.S. Pat. No. 2,681, 294. The vacuum film formation method is not specifically defined, but is preferably a film formation method by vapor deposition or plasma CVD. In the present invention, the polymer may be applied for coating as its solution, or a hybrid coating method along with an inorganic material, as in JP-A 2000-323273 and 2004-25732, may also be used. A vapor deposition method is advantageous in the formation of the organic layer in the present invention from the viewpoints of higher curing speed, densification of the layer, and reduction of a residual solvent amount.

In the present invention, the composition comprising the polymerizable monomer is cured by irradiation. The light for irradiation is generally a UV ray from a high-pressure mercury lamp or low-pressure mercury lamp. The radiation energy is preferably at least 0.1 J/cm$^2$, more preferably at least 0.5 J/cm$^2$. (Meth)acrylate series compounds may suffer from interference in polymerization owing to oxygen in air, and therefore, in their polymerization, the oxygen concentration or the oxygen partial pressure is preferably lowered. In the case where the oxygen concentration in polymerization is lowered according to a nitrogen purging method, the oxygen concentration is preferably not more than 2%, more preferably not more than 0.5%. In the case where the oxygen partial pressure in polymerization is lowered by a pressure reduction method, the whole pressure is preferably not more than 1000 Pa, more preferably not more than 100 Pa. Especially preferred is UV polymerization with at least 0.5 J/cm$^2$ energy radiation under a condition of reduced pressure of not more than 100 Pa.

The organic layer is preferably smooth and has high membrane strength. The mean roughness (Ra) of 1 μm$^2$ of the organic layer is preferably not more than 1 nm, more preferably not more than 0.5 nm. Preferably, the rate of polymerization of monomer is at least 85%, more preferably at least 88%, even more preferably at least 90%, still more preferably at least 92%. The rate of polymerization as referred to herein means the ratio of the reacted polymerizable group to all the polymerizing group (acryloyl group and methacryloyl group) in the monomer mixture. The rate of polymerization may be quantitatively determined according to IR absorptiometry.

The thickness of the organic layer is not specifically defined. However, when the layer is too thin, then its thickness could hardly keep uniformity; but when too thick, the layer may be cracked by external force applied thereto and its barrier property may lower. From these viewpoints, the thickness of the organic layer is preferably from 50 nm to 2000 nm, more preferably from 200 nm to 1500 nm.

As so mentioned in the above, the organic layer is preferably smooth. The mean roughness (Ra) is preferably not more than 1 nm, more preferably not more than 0.5 nm. The surface of the organic layer is required not to have impurities and projections such as particles. Accordingly, it is desirable that the organic layer is formed in a clean room. The degree of cleanness is preferably not more than class 10000, more preferably not more than class 1000.

Preferably, the hardness of the organic layer is higher. It is known that, when the hardness of the organic layer is high, then the inorganic layer may be formed smoothly and, as a result, the barrier level of the gas barrier film is thereby improved. The hardness of the organic layer may be expressed as a microhardness based on a nano-indentation method. The microhardness of the organic layer is preferably at least 100 N/mm, more preferably at least 150 N/mm.

(Inorganic Layer)

The inorganic layer is, in general, a layer of a thin film formed of a metal compound. For forming the inorganic layer, employable is any method capable of producing the intended thin film. For it, for example, suitable are physical vapor deposition methods (PVD) such as vapor evaporation method, sputtering method, ion plating method; various chemical vapor deposition methods (CVD); liquid phase growth methods such as plating or sol-gel method. Not specifically defined, the component to be in the inorganic layer may be any one satisfies the above-mentioned requirements. For example, it includes metal oxides, metal nitrides, metal carbides, metal oxide-nitrides, or metal oxide-carbides. Preferably used are oxides, nitrides, carbides, oxide-nitrides, or oxide-carbides comprising at least one metal selected from Si, Al, In, Sn, Zn, Ti, Cu, Ce and Ta. Of those, preferred are oxides, nitrides, carbides, oxide-nitrides, or oxide-carbides of a metal selected from Si, Al, In, Sn, Zn and Ti; more preferred are oxides, nitrides or oxide-nitrides with Si or Al. These may contain any other element as a subsidiary component. The present invention is advantageous because the barrier laminate having high barrier property is obtained even if its inorganic layer is produced by using a metal oxide as a material thereof through plasma process.

Preferably, the surface smoothness of the inorganic layer formed in the present invention is less than 1 nm in terms of the mean roughness (Ra value) in 1 μm square, more preferably not more than 0.5 nm. Accordingly, it is desirable that the inorganic layer is formed in a clean room. Preferably, the degree of cleanness is not more than class 10000, more preferably not more than class 1000.

Not specifically defined, the thickness of the inorganic layer is generally within a range of from 5 to 500 nm/layer, preferably from 10 to 200 nm/layer. The inorganic layer may be a laminate composed of a plurality of sub-layers. In this case, each sub-layer may have the same composition, or a different composition. In addition, as so mentioned hereinabove and as disclosed in UP Laid-Open 2004-46497, the inorganic layers may be gradation layers of which the composition changes continuously in the thickness direction of the layer, with no definite boundary to the adjacent inorganic layer.

(Lamination of Organic Layer and Inorganic Layer)

The organic layer and the inorganic layer may be laminated by repeated film formation to form the organic layer and the inorganic layer in a desired layer constitution. In case where the inorganic layer is formed according to a vacuum film formation method such as sputtering method, vacuum evaporation method, ion plating method or plasma CVD method (plasma chemical vapor deposition method), then it is desirable that the organic layer is also formed according to a vacuum film formation method such as the above-mentioned flash vapor deposition method.

Heretofore, when an inorganic layer on an organic layer is laminated by CVD method (chemical vapor deposition method) in formation of a barrier laminate, haze easily appeared. However, the barrier laminate is favorable because appearance of haze can be suppressed in formation of the barrier laminate of the invention even if the inorganic layer is formed by CVD method. In addition, the barrier laminate is favorable because it can provide a film having more excellent surface smoothness even if the inorganic layer of the barrier laminate is farmed by sputtering method.

While the barrier layer is formed, it is especially desirable that the organic layer and the inorganic layer are laminated all the time in a vacuum of not more than 1000 Pa, not restoring the pressure to an atmospheric pressure during the film formation. More preferably, the pressure is not more than 100 Pa, even more preferably not more than 50 Pa, still more preferably not more than 20 Pa.

Particularly, in the case where at least two organic layers and at least two inorganic layers are laminated alternately, the present invention can achieve higher barrier property.

(Functional Layer)

The device of the present invention may have a functional layer on the barrier laminate or in any other position. The functional layer is described in detail in JP-A 2006-289627, paragraphs 0036 to 0038.

(Use of Barrier Laminate)

In general, the barrier laminate of the present invention is formed on a support. Selecting the support, the barrier laminate may have various applications. The support includes a substrate film, as well as various devices, optical members, etc. Concretely, the barrier laminate of the present invention may be used as a barrier layer of a gas barrier film. The barrier laminate and the gas barrier film of the present invention may be used for sealing up devices that require gas-barrier property. The barrier laminate and the gas barrier film of the present invention may apply optical members. These are described in detail hereinunder.

(Gas Barrier Film)

The gas barrier film comprises a substrate film and a barrier laminate formed on the substrate film. In the gas barrier film, the barrier laminate of the present invention may be provided on only one surface of the substrate film, or may be provided on both surfaces thereof. The barrier laminate of the present invention may be laminated in an order of an inorganic layer and an organic layer from the side of the substrate film; or may be laminated in an order of an organic layer and an inorganic layer from it. The uppermost layer of the laminate of the present invention may be an inorganic layer or an organic layer.

The gas barrier film of the present invention is a film substrate having a barrier layer that functions to block oxygen, water, nitrogen oxide, sulfur oxide, ozone and others in air.

Not specifically defined, the number of the layers that constitute the gas barrier film may be typically from 2 layers to 30 layers, more preferably from 3 layers to 20 layers.

The gas barrier film may have any other constitutive components (e.g., functional layers such as adhesive layer) in addition to the barrier laminate and the substrate film. The functional layer may be disposed on the barrier laminate, or between the barrier laminate and the substrate film, or on the side (back) of the substrate film not coated with the barrier laminate.

(Plastic Film)

In the gas barrier film of the present invention, the substrate film is generally a plastic film. Not specifically defined in point of the material and the thickness thereof, the plastic film usable herein may be any one capable of supporting a laminate of an organic layer and an inorganic layer; and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the gas barrier film of the present invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of not less than 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclicpolyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (Mitsubishi gas chemical company's Neopulim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

In the case where the gas barrier film of the present invention is used in combination with a polarizing plate, it is preferable that the gas barrier layer surface of the gas barrier film is faced at the inside of a cell and is disposed in the innermost (adjacent to the device). At that time, since the gas barrier film is disposed in the inside of the cell relative to the polarizing plate, a retardation value of the gas barrier film is important. As to a use foist of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the present invention is utilized as a device such as organic EL devices, the plastic film must be transparent, namely its light transmittance is usually not less than 80%, preferably not less than 85%, and more preferably not less than 90%. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the present invention is used for display use, for example, when it is not disposed on the side of an observer, the transparency is not always required. Accordingly, in such case, an opaque material can also be used as the plastic film. Examples of the opaque material include a known liquid crystal polymer such as polyimides and polyacrylonitrile.

The thickness of the plastic film to be used for the gas barrier film of the present invention is properly chosen depending upon the use and therefore, is not particularly limited. It is typically from 1 to 800 μm, preferably from 10 to 200 μm. These plastic films may have a functional layer such as a transparent conductive layer and a primer layer. The functional layer is described in detail in paragraphs 0036 to 0038 of JP-A-2006-289627.

The gas barrier film of the invention are favorably used for sealing devices that are deteriorated by water, oxygen, or the like, even if the devices are used under ordinary temperatures and pressures over years. Examples of the devices are organic EL devices, liquid-crystal display devices, solar cells, touch panels, or the like.

The barrier laminate of the present invention may be used for film-sealing of devices. Specifically, this is a method of providing a barrier laminate of the present invention on the surface of a device serving as a support by itself. Before providing the barrier laminate, the device may be covered with a protective layer.

The gas barrier film of the present invention may be used as a substrate of a device or as a film for sealing up according to a solid sealing method. The solid sealing method comprises forming a protective layer on a device, then forming an adhesive layer and a gas barrier film as laminated thereon, and curing it. Not specifically defined, the adhesive may be a thermosetting epoxy resin, a photocurable acrylate resin, etc.

(Organic EL Device)

Examples of an organic EL device with a gas barrier film are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the gas barrier film of the present invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the substrate of the present invention may be sued as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensatory bent) type, a CPA (continuous pinwheel alignment) type, or an IPS (in-plane switching) type.

(Solar Cell)

The gas barrier film of the invention can be used also as a sealing film for solar cell devices. Preferably, the gas barrier film of the invention is used for sealing a solar cell device in such a manner that its adhesive layer is on the side near to the solar cell device. The solar cell devices for which the gas barrier film of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like Group compound semiconductor-based solar cell devices.

(Others)

Other applications of the present invention are thin-film transistors as in JP-T 10-512104, touch panels as in JP-A 5-127822, 2002-48913, and electronic papers as in JP-A 2000-98326.

(Optical Member)

An example of the optical member that comprises the barrier laminate of the present invention is a circular polarizer.

(Circular Polarizer)

Laminating a gas barrier film of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the present invention are described more concretely with reference to the following Examples. In the following Examples, the material used, its amount and the ratio, the details of the treatment and the treatment process may be suitably modified or changed not overstepping the sprit and the scope of the present invention. Accordingly, the present invention should not be limitatively interpreted by the Examples mentioned below.

Example 1

On a polyethylene naphthalate film (manufactured by DuPont, Teonex Q65FA having a thickness of 100 μm), a composition comprising the polymerizable monomer described in the following table (the total amount was 14 parts by weight), the initiator (Sartomer, Esacure KTO46, 1 parts by weight) and 2-butanone (185 parts by weight) was coated using a wire bar, and then, cured through irradiation with UV rays at a dose of 0.5 J/cm² in atmosphere having 100 ppm of oxygen, thereby producing the organic layer. $Al_2O_3$ (inorganic layer) was deposited on the surface of the formed organic layer according to a vacuum sputtering method (reactive sputtering) to form a layer having thickness of 40 nm, thereby producing a gas barrier film. The obtained gas barrier films were tested and evaluated for barrier property (water vapor permeability) and average roughness according to the methods below.

<Evaluation of Water Vapor Permeability According to Ca Method (Barrier Property)>

The water vapor permeability (g/m²/day) was measured according to the method described in G. NISATO, P.C.P. BOUTEN, P. J. SLIKKERVEER, et al.; SID Conference Record of the International Display Research Conference 1435-1438. The measure was carried out at 40° C. and 90% RH. The results were evaluated as follows;

X: more than 0.001 g/m²/day

◯: not more than 0.001 g/m²/day to not less than 0.0005 g/m²/day

◎: less than 0.0005 g/m²/day

<Measurement of Mean Surface Roughness (Ra) (Unit: nm)>

The surface roughness of the inorganic layer was measured using an atomic force microscope (AFM). In this case, the smoothness was expressed as a mean roughness Ra (unit, m) within a sample area of 1 μm square. The results were evaluated as follows;

X: more than 2 nm

◯: not more than 2 nm to not less than 0.5 nm

◎: less than 0.5 nm

<Measurement for Adhesiveness>

Adhesiveness test compliant to JIS K5400 was carried out. The surface of the gas barrier films at the barrier layer side was cut in at the entering angle of 90 degree toward the film surface at 1 mm interval, thereby producing one hundred of cross-cut at 1 mm interval. On the surface thereof, mylar tape having the wide of 2 cm (manufactured by Nitto Denko, polyester tape, No. 31B) was attached, and then was peeled off using a tape peeling testing machine. The number of the remaining grids which i't peel off from the organic layer was counted.

◎: 100

◯: 99 to 60

Δ: 59 to 20

X: 19 to 0

TABLE 1

| | Composition 1 | | Composition 2 | | Compound 3 | | | | |
|---|---|---|---|---|---|---|---|---|---|
| | Monomer | Amount (parts by weight) | Monomer | Amount (parts by weight) | Monomer | Amount (parts by weight) | Barrier property | Ra | Adhesiveness |
| Example 1 | A | 100 | — | — | — | — | ◎ | ◎ | ◯ |
| Example 2 | B | 100 | — | — | — | — | ◯ | ◎ | Δ |
| Example 3 | C | 100 | — | — | — | — | ◯ | ◯ | Δ |
| Example 4 | D | 100 | — | — | — | — | ◎ | ◎ | ◯ |
| Example 5 | D | 70 | E | 30 | — | — | ◎ | ◎ | — |
| Example 6 | D | 95 | F | 5 | — | — | ◎ | ◎ | ◎ |
| Example 7 | D | 65 | E | 30 | F | 5 | ◎ | ◎ | — |
| Comparative Example 1 | G | 100 | — | — | — | — | X | X | X |
| Comparative Example 2 | H | 100 | — | — | — | — | X | ◯ | X |
| Comparative Example 3 | E | 100 | — | — | — | — | X | X | — |

In the above table, the compositions A to H each comprise the following compounds A to H as a main component, respectively. The composition D includes 70% by weight or less of the compound D.

Compound A
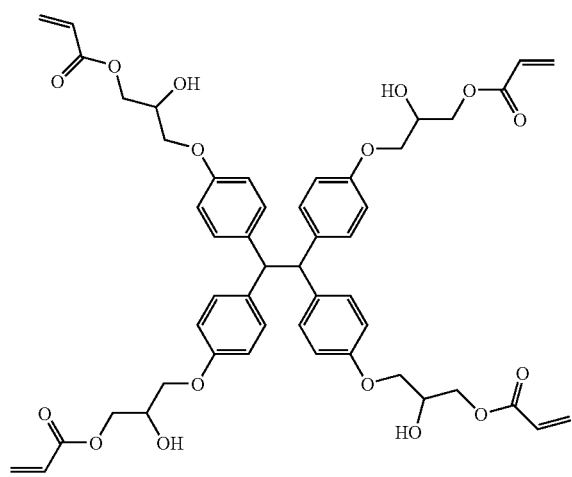
Compound B
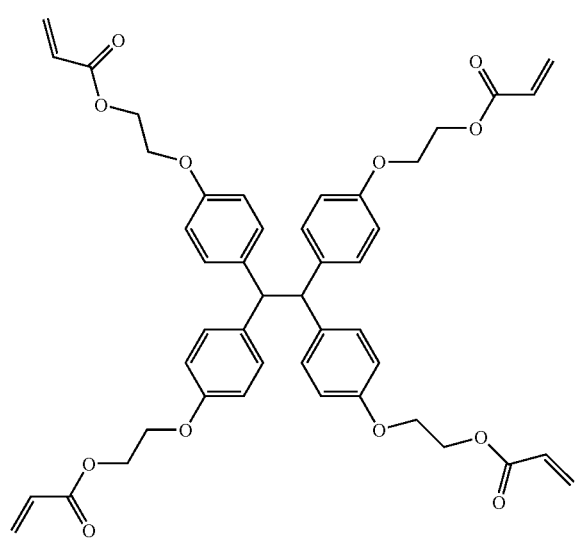
Compound C
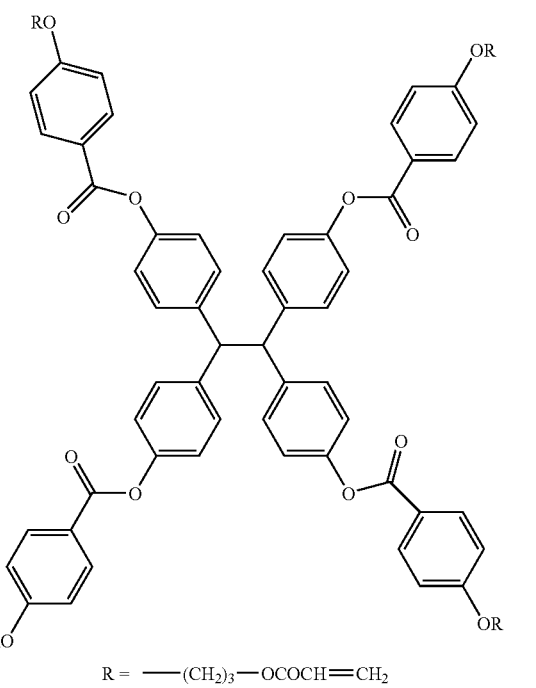
R = —(CH$_2$)$_3$—OCOCH=CH$_2$
Compound D
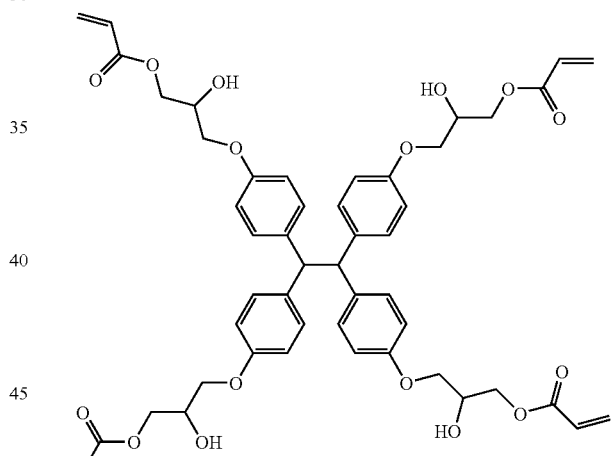
Compound E
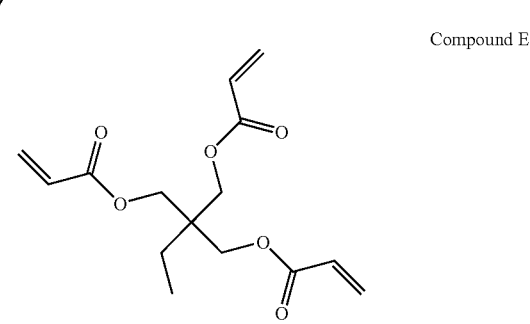
Compound F
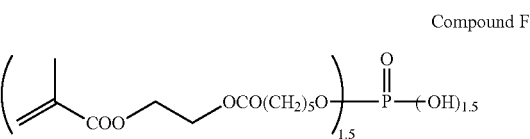

-continued

Compound G

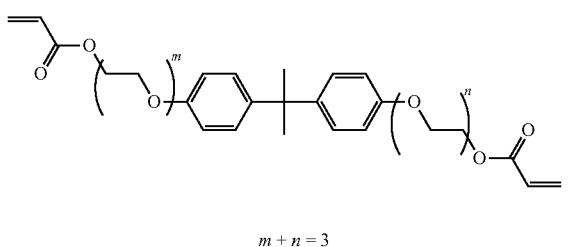

m + n = 3

Compound H

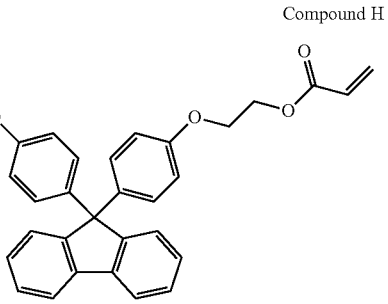

Compound E: Light-Acrylate TMP-A, manufactured by KYOEISHA CHEMICAL Co., LTD
Compound F: KAYAMER PM-21, manufactured by Nippon-kayaku Co., LTD.
Compound G: NK ester ABE-300, manufactured by Shin-Nakamura chemical Co., Ltd.
Composition H: NK ester A-BPEF, manufactured by Shin-Nakamura chemical Co., Ltd.

The composition A was analyzed according to HPLC. The purity thereof was roughly calculated from the area ratio of the peak which appears at the retention time of 22.3 minute. The result showed that the composition A comprises compounds which are corresponding to two-functional compounds, three-functional compounds or five-functional compounds and isomers thereof.
HPLC Analysis Condition
Column: CAPCELLPAK UG120 (3 mm×250 mm)
Flow rate: 0.2 ml/min
Eluent: A is $H_2O$ (10 mM ammonium acetate), B is acetonitrile/$H_2O$=9:1 (10 mM ammonium acetate)
Gradient: B is from 25% (5 minutes) to 100% (30 minutes)

Example 2

A gas barrier film was formed by the same method as that in Example 1, except that the inorganic layer was replaced an inorganic layer of SiNH which was formed by a CVD method. The barrier property, the adhesiveness and the haze value of the obtained film were tested and evaluated. Herein, the haze value was measured using a haze meter (manufactured by Nippon denshoku industries Co., Ltd., NDH2000). The results were shown below.

TABLE 2

| | | Composition 1 | | | |
| --- | --- | --- | --- | --- | --- |
| | Monomer | Amount (parts by weight) | Barrier property (g/m²/day) | Ra | Haze value |
| Example 8 | A | 100 | 0.00012 | 0.63 | 0.57 |
| Comparative Example 4 | G | 100 | 0.00028 | 1.59 | 1.81 |

[Evaluation in Organic EL Device]
In order to evaluate gas barrier property, an organic EL device in which vapor or oxygen causes dark spot was formed. An ITO film-having conductive glass substrate (surface resistivity, 10 Ω/square) was washed with 2-propanol, and then processed for UV ozone treatment for 10 minutes. On the substrate (anode), the following compound layers were formed in order by vapor deposition according to a vacuum vapor deposition method.
(First Hole Transporting Layer)
Copper phthalocyanine: film thickness 10 nm.
(Second Hole Transporting Layer)
N,N'-diphenyl-N,N'-dinaphthylbenzidine: film thickness 40 nm.
(Light-Emitting Layer Also Serving as Electron Transporting Layer)
Tris(8-hydroxyquinolinato) aluminium: film thickness 60 mm.
(Electron Injection Layer)
Lithium fluoride: film thickness 1 nm.
A metal aluminium was formed on it through vapor deposition to form a cathode having a thickness of 100 nm, and a silicon nitride film having a thickness of 3 μm was formed thereon according to a parallel plate CVD method, thereby constructing an organic EL device.

Gas barrier films were formed by laminating alternately two organic layers and two inorganic layers on the gas barrier films of Examples 1 to 8, respectively. Each of the organic layers has the same composition as that of the organic layers of Examples 1 to 8.

Next, using a thermosetting adhesive (Epotec 310, by Daizo-Nichimori), each of the above-obtained gas barrier films and the organic EL device were stuck together in such a manner that the side of the barrier film substrate laminated with barrier layer could be on the side of the organic EL device, and heated at 65° C. for 3 hours to cure the adhesive. 10 test pieces of the thus-sealed organic EL device were prepared.

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot.

Finally, the devices were stored in a dark room at 60° C. and 90% RH for 24 hours, and then tested for light emission. All of the devices were not observed dark spots larger than 200 μm in diameter. It was found that the devices were excellent in durability While the present invention has been described in detail and with reference to specific embodiments thereof, it will be apparent to one skilled in the art that various changes and modifications can be made therein without departing from the scope thereof.

The present disclosure relates to the subject matter contained in Japanese Patent Application No. 049174/2009 filed on Mar. 3, 2009, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A barrier laminate comprising at least one organic layer and at least one inorganic layer, wherein the organic layer is obtained by curing a polymerizable composition comprising a compound represented by the following formula (1);

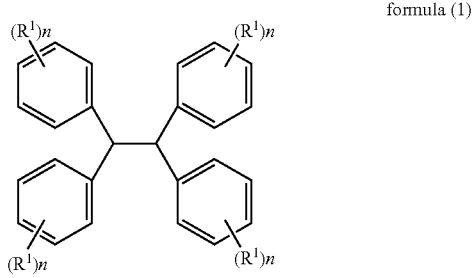

formula (1)

wherein $R^1$'s represent a substituent, and $R^1$'s each may be the same or different to each other; n's are an integer of 0 to 5, and n's each may be the same or different to each other; provided that at least one of $R^1$'s comprises a polymerizable group.

2. The barrier laminate according to claim 1, wherein the polymerizable group in the formula (1) is a (meth)acryloyl group.

3. The barrier laminate according to claim 1, wherein the compound represented by the formula (1) has two or more polymerizable groups.

4. The barrier laminate according to claim 1, wherein the compound represented by the formula (1) has three or more polymerizable groups.

5. The barrier laminate according to claim 1, wherein at least one of $R^1$'s is a group consisting of a polymerizable group and at least one selected from —$CR^2_2$— ($R^2$ represents a hydrogen atom or a substituent), —CO—, —O—, and a phenylene group.

6. The barrier laminate according to claim 1, wherein at least one of $R^1$'s comprises a hydroxy group.

7. The barrier laminate according to claim 1, wherein at least one of $R^1$'s has a molecular weight of 10 to 250.

8. The barrier laminate according to claim 1, wherein at least two of $R^1$'s have the same structure to each other.

9. The barrier laminate according to claim 1, wherein at least one of $R^1$'s has a molecular weight of 70 to 150.

10. The barrier laminate according to claim 1, wherein the compound represented by the formula (1) has a molecular weight of 600 to 1400.

11. The barrier laminate according to claim 1, wherein the polymerizable composition further comprises an acidic monomer.

12. The barrier laminate according to claim 11, wherein the acidic monomer has a (meth)acrylate having a phosphate group.

13. The barrier laminate according to claim 1, wherein the inorganic layer comprises a metal oxide or a metal nitride.

14. The barrier laminate according to claim 13, wherein the metal oxide or the metal nitride is silicon oxide, aluminum oxide, or silicon aluminum oxide.

15. The barrier laminate according to claim 13, wherein the inorganic layer comprising the metal oxide or the metal nitride is an inorganic layer formed by a sputtering method or a CVD method.

16. The barrier laminate according to claim 1, wherein at least two organic layers and at least two inorganic layers are alternately laminated.

17. A gas barrier film comprising a barrier laminate on a substrate film, wherein the barrier laminate comprises at least one organic layer and at least one inorganic layer, and the organic layer is obtained by curing a polymerizable composition comprising a compound represented by the following formula (1);

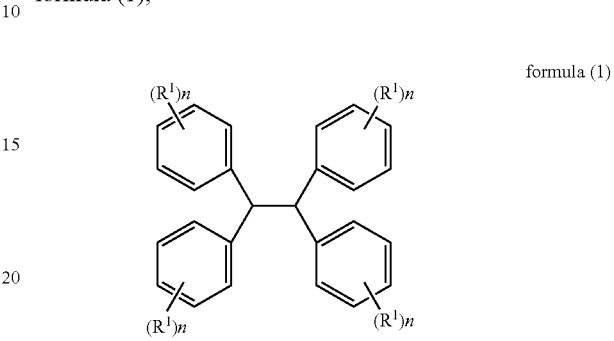

formula (1)

wherein $R^1$'s represent a substituent, and $R^1$'s each may be the same or different to each other; n's are an integer of 0 to 5, and n's each may be the same or different to each other; provided that at least one of $R^1$'s comprises a polymerizable group.

18. A device comprising a barrier laminate, wherein the barrier laminate comprises at least one organic layer and at least one inorganic layer, and the organic layer is obtained by curing a polymerizable composition comprising a compound represented by the following formula (1);

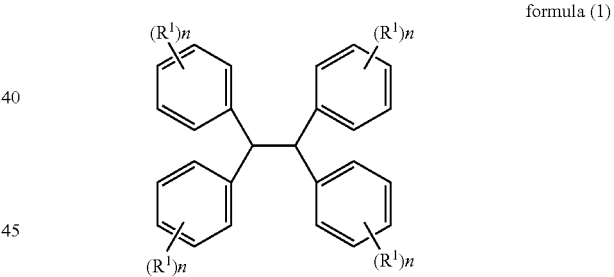

formula (1)

wherein $R^1$'s represent a substituent, and $R^1$'s each may be the same or different to each other; n's are an integer of 0 to 5, and n's each may be the same or different to each other; provided that at least one of $R^1$'s comprises a polymerizable group.

19. The device according to claim 18, which comprises, as a substrate, a gas barrier film comprising the barrier laminate.

20. The device according to claim 18, which is sealed with the barrier laminate, or a gas barrier film comprising the barrier laminate.

21. The device according to claim 18, wherein the device is an electronic device.

22. The device according to claim 18, wherein the device is an organic electroluminescence device.

23. A method for manufacturing a barrier laminate comprising at least one organic layer and at least one inorganic layer, which comprises forming the organic layer by curing a polymerizable composition comprising a compound represented by the following formula (1);

formula (1)
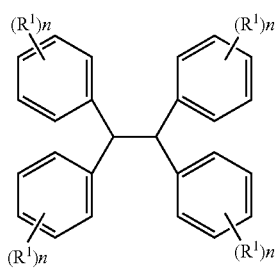
wherein $R^1$'s represent a substituent, and $R^1$'s each may be the same or different to each other; n's are an integer of 0 to 5, and
n's each may be the same or different to each other; provided that at least one of $R^1$'s comprises a polymerizable group, and forming an inorganic layer by a sputtering method or a CVD method.
* * * * *